(12) United States Patent
Stickler et al.

(10) Patent No.: US 6,626,684 B1
(45) Date of Patent: Sep. 30, 2003

(54) NANOTUBE SOCKET SYSTEM AND METHOD

(75) Inventors: Heather Lea Stickler, Fort Collins, CO (US); Samuel Martin Babb, Fort Collins, CO (US); Paul Howard Mazurkiewicz, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/178,124

(22) Filed: Jun. 24, 2002

(51) Int. Cl.[7] .................................. H01R 4/58
(52) U.S. Cl. ............................ 439/87; 439/91
(58) Field of Search ............................ 439/87, 91, 86, 439/66

(56) References Cited

U.S. PATENT DOCUMENTS 5,142,449 A * 8/1992 Littlebury et al. .......... 361/782
6,031,711 A * 2/2000 Tennent et al. ............. 361/303
6,205,016 B1 * 3/2001 Niu ............................. 361/503
6,407,922 B1 * 6/2002 Eckblad et al. ............. 361/704
6,414,836 B1 * 7/2002 Tennent et al. ............. 361/313
6,444,102 B1 * 9/2002 Tucci et al. ................. 204/279
6,454,816 B1 * 9/2002 Lee et al. .................... 29/25.03
6,455,771 B1 * 9/2002 Han et al. ............... 174/35 MS

OTHER PUBLICATIONS

Philip G. Collins and Phaedon Avouris, Nanotubes for Electronics, Scientific American, Dec. 2000, pp. 62–69.

* cited by examiner

Primary Examiner—Gary Paumen
Assistant Examiner—James R. Harvey

(57) ABSTRACT

A socket comprises a substrate having a plurality of cavities extending therethrough. The socket also comprises an electrically-conductive carbon nanotube structure disposed within at least one of the cavities.

37 Claims, 2 Drawing Sheets

NANOTUBE SOCKET SYSTEM AND METHOD

TECHNICAL FIELD OF THE INVENTION

The present invention relates generally to the field of electronics and, more particularly, to a nanotube socket system and method.

BACKGROUND OF THE INVENTION

As electronics have become increasingly sophisticated, the density of electronic components on devices, such as printed circuit boards, has also increased. Accordingly, locating and connecting each component on the printed circuit board remains challenging. For example, an application specific integrated circuit may easily contain hundreds or even thousands of electrically-conductive contacts disposed within a relatively small area for coupling to the printed circuit board.

One example of a device used to connect integrated circuits or semiconductor chips to printed circuit boards is a socket. Sockets generally include an array of electrically-conductive contacts, such as pins or pads, corresponding to the locations of contacts of the semiconductor chip. The socket is generally coupled to the printed circuit board such that the semiconductor chip may be easily inserted into or removed from the socket without disruption of the socket or disconnection of the socket from the printed circuit board. Contacts disposed on the underside of the socket are used to make the required connections to the printed circuit board.

However, present sockets may suffer from movement within the printed circuit board/chip interface, thereby causing momentary open circuits or disconnects. For example, during use of the electronic device, thermal energy may cause variable expansion rates between different components of the device, thereby causing momentary open circuits or disconnects. Vibration and other factors may also cause such disconnects.

SUMMARY OF THE INVENTION

In accordance with one embodiment of the present invention, a socket comprises a substrate having a plurality of cavities extending through the substrate, and an electrically-conductive carbon nanotube structure disposed within at least one of the cavities.

In accordance with another embodiment of the present invention, a method for producing a socket comprises providing a substrate having a plurality of cavities extending therethrough. The method also comprises providing at least one electrically-conductive carbon nanotube structure and disposing the carbon nanotube structure within at least one of the cavities.

BRIEF DESCRIPTION OF THE DRAWINGS

For a more complete understanding of the present invention and the advantages thereof, reference is now made to the following descriptions taken in connection with the accompanying drawings in which.

DETAILED DESCRIPTION OF THE DRAWINGS

Figure 1:
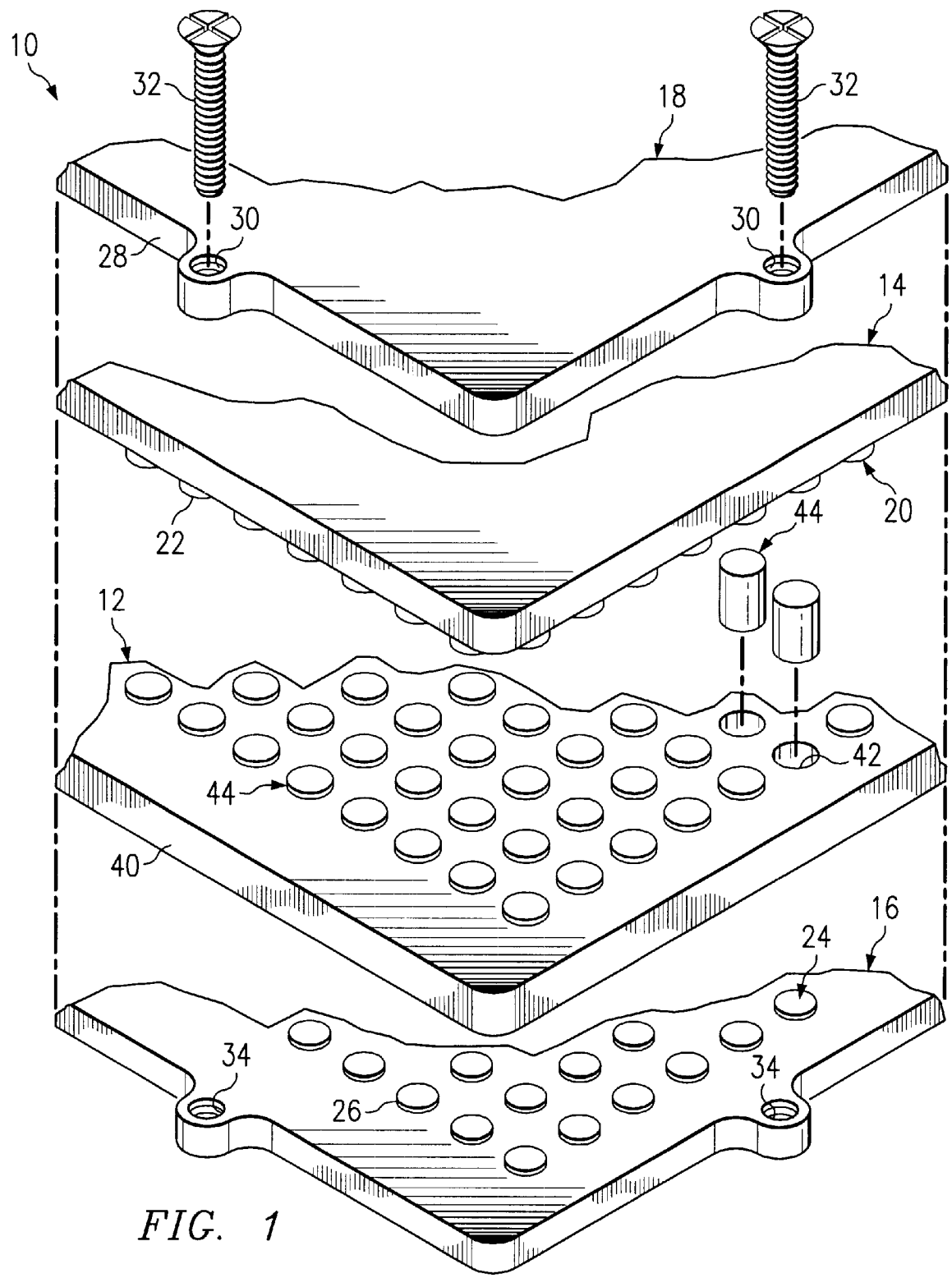
FIG. 1 is a diagram illustrating an exploded view of an embodiment of a socket system in accordance with the present invention.
Figure 2:
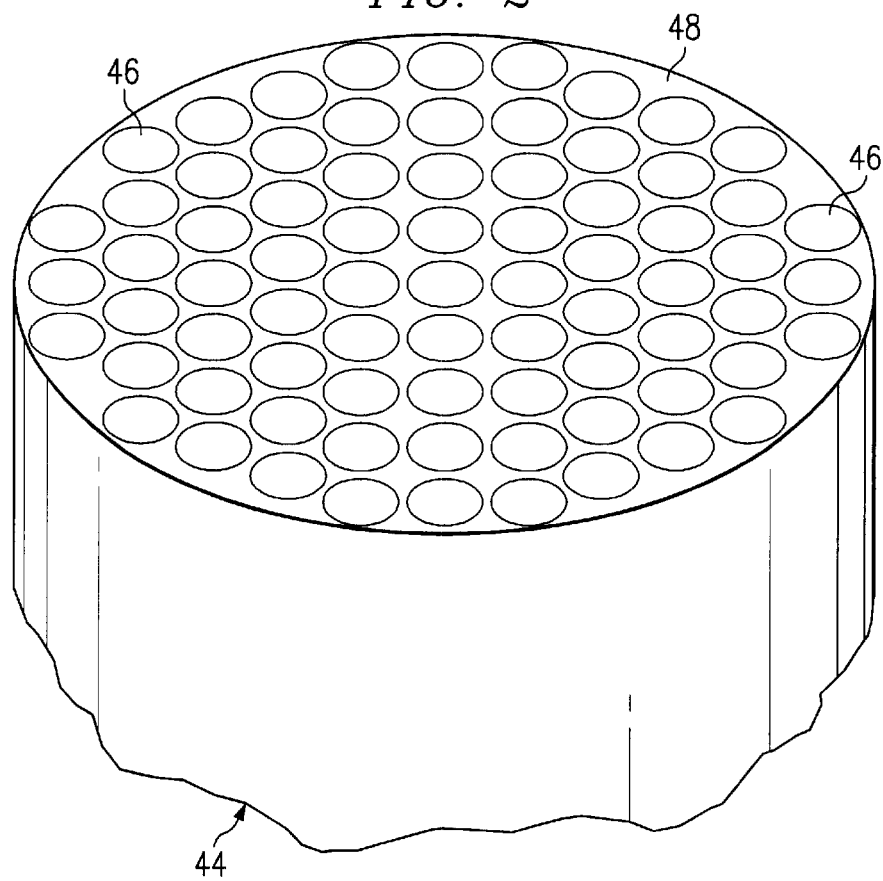
FIG. 2 is a diagram illustrating an embodiment of a nanotube structure of a socket system in accordance with the present invention.

The preferred embodiments of the present invention and the advantages thereof are best understood by referring to FIGS. 1 and 2 of the drawings, like numerals being used for like and corresponding parts of the various drawings.

FIG. 1 is a diagram illustrating an exploded assembly view of an embodiment of a socket system 10 in accordance with the present invention. In the illustrated embodiment, system 10 comprises a socket 12, an electronic component 14, a printed circuit board 16, and a mounting assembly 18. Briefly, socket 12 is adapted to support component 14 and electrically interface with component 14 and printed circuit board 16 to provide electrically-conductive paths between printed circuit board 16 and component 14. Mounting assembly 18 may be used to secure component 14 and socket 12 to printed circuit board 16. However, as described in greater detail below, system 10 may also be configured without mounting assembly 18.

In the illustrated embodiment, component 14 comprises an integrated circuit or chip 15 having contacts 20 for providing an electrical connection to internal circuitry of chip 15. However, it should be understood that socket 12 may be configured to interface with other types of electronic components 14. In the illustrated embodiment, contacts 20 comprise conductive pads 22 for providing the electrical connection to internal circuitry of component 14; however, it should also be understood that pins, columns, or other types of electrically conductive structures may be provided on component 14 for providing an electrically-conductive path to the internal circuitry of component 14.

Printed circuit board 16 may comprise a single-layer or multi-layer printed circuit board 16. In the illustrated embodiment, printed circuit board 16 comprises a plurality of contacts 24 for providing electrical connections to printed circuit board 16. In the illustrated embodiment, contacts 24 comprise electrically-conductive pads 26; however, it should be understood that pins, columns, vias, other types of electrical conduits may be used on printed circuit board 16 for providing electrical conductivity between printed circuit board 16 and another device.

In the illustrated embodiment, mounting assembly 18 comprises a plate 28 having a plurality of openings 30 each adapted to receive a fastener 32. In operation, fasteners 32 extend through openings 30 and into corresponding openings 34 formed in printed circuit board 16 such that mounting assembly 18 secures component 14 and socket 12 to printed circuit board 16. For example, mounting assembly 18 may be used to generate and apply a clamping force between printed circuit board 16 and plate 28. However, it should also be understood that other devices or assemblies may be used to secure component 14 and/or socket 12 to printed circuit board 16 or to secure component 14 to socket 12. Additionally, in the illustrated embodiment, mounting assembly 18 is configured such that a portion of mounting assembly is integrally configured with printed circuit board 16. However, it should be understood that mounting assembly 18 may also be configured to be a separate assembly attachable to printed circuit board 16.

Socket 12 comprises a substrate 40 having a plurality of cavities 42 formed therein, one or more of the cavities 42 extending through substrate 40. Cavities 42 are generally formed coincident with locations of contacts 20 of component 14. Correspondingly, contacts 24 are formed on printed circuit board 16 generally coincident with cavities 42 to provide an electrical conductivity path from printed circuit board 16 to component 14. Socket 12 also preferably comprises a carbon nanotube structure 44 disposed within one or more cavities 42 corresponding to contacts 20 and 24 to provide an electrical conductivity path between contacts 20 and 24. Structures 44 may be secured within cavities 42 of substrate 40 using mechanical and/or non-mechanical methods. For example, adhesives, resins, elastomers, mechanical fastening structures, freeze-plug installation, or other devices or methods may be used to secure structures 44 within cavities 42.

FIG. 2 is a diagram illustrating an embodiment of carbon nanotube structure 44 in accordance with the present invention. Each structure 44 comprises a matrix of carbon nanotubes 46 and a binder 48. Carbon nanotubes 46 may comprise a single-wall structure, double-wall structure, or other configuration of carbon nanotube formation. Nanotubes 46 may be configured extending the length of structure 44 such that nanotubes 46 extend axially to opposing surfaces of structure 44. However, multiple segments of nanotubes 46 may also be used to form an electrically-conductive path extending to opposing surfaces of structure 44. For example, in one embodiment, one or more segments of nanotubes 46 may be contiguously positioned horizontally, vertically, or geometrically otherwise, relative to each other within binder 48 to form an electrically-conductive path through structure 44. Additionally, nanotubes 46 may be axially or vertically aligned within binder 48 coincident with a longitudinal direction or axis of structure 44 or may be otherwise angularly positioned within binder so as to provide electrical conductivity through structure 44. Binder 48 may comprise a resin, elastomer, adhesive, or other agent for binding or otherwise combining nanotubes 46 to form structure 44.

In operation, each carbon nanotube structure 44 provides an electrical conductivity path extending from printed circuit board 16 to component 14. Nanotube structures 44 comprise mechanical and physical properties that substantially resist compressive forces directed along an axial direction of structure 44 while providing electrical conductivity.

Figure 3:
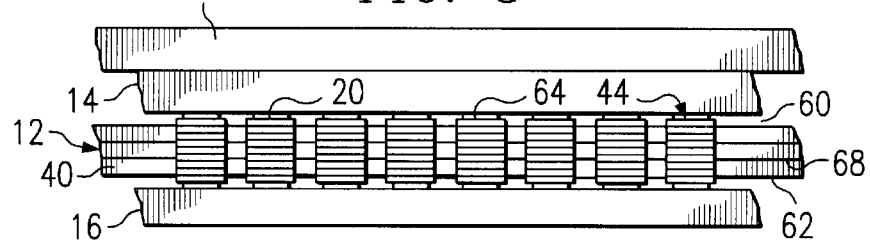
FIG. 3 is a diagram illustrating a cross-sectional view of an embodiment of a socket system in accordance with the present invention.

FIG. 3 is a diagram illustrating an embodiment of a sectional view of socket system 10 in accordance with the present invention. In the illustrated embodiment, cavities 42 are formed generally perpendicular to planar surfaces of component 14 and printed circuit board 16; however, it should be understood that cavities 42 may be formed at other angular orientations relative to component 14 and printed circuit board 16. Accordingly, structures 44 may also be disposed at a variety of angular orientations relative to component 14 and printed circuit board 16 to provide a variety of angular electrical conductivity paths through substrate 40.

As illustrated in FIG. 3, nanotube structures 44 extend upwardly beyond an upwardly-disposed side or surface 60 of substrate 40 and extend downwardly beyond a downwardly-disposed side or surface 62 of substrate 40. It should be understood that "upwardly" and "downwardly" as referred to above reflect the illustrated positions of surfaces 60 and 62 in FIG. 3; however, opposed surfaces 60 and 62 may be otherwise positioned: corresponding to a position of substrate 40. Extending structures 44 beyond surfaces 60 and 62 of substrate 40 maintains contact between structures 44 and contacts 20 and 24 independent of expansion or contraction of printed circuit board 16 or component 14. For example, structures 44 generally exhibit a Young's modulus typically over one tera-Pascal and have tensile strength properties generally in excess of 100 giga-Pascals. Structures 44 also exhibit compressible properties such that in response to the removal of a compressive force applied to structure 44, structure 44 returns substantially to an original uncompressed form. Thus, in operation, clamping forces may be applied between component 14 and socket 12 and/or between socket 12 and printed circuit board 16 to compress structures 44. Thus, the compressive forces applied to structures 44 resist separation or disconnection of structures 44 relative to contacts 20 and/or 24 independent of expansion or contraction of component 14, substrate 40, and/or printed circuit board 16.

Each carbon nanotube structure 40 may comprise a single unit or may be formed of a plurality of carbon nanotube units 64 coupled together to form structure 44 having a desired length to accommodate a thickness of substrate 40. Units 64 may be coupled together using a variety of methods, such as, but not limited to, adhesives, elastomers, mechanical structures, or other securing devices or methods. Units 64 are coupled together to provide an electrically conductive path between contacts 20 and 24. Each structure 44 may also be electrically coupled to one or more layers 66 of substrate 40, thereby providing additional conductive paths away from or toward component 14. For example, a conductive layer 66 of socket 12, such as a power or ground plane, may electrically engage carbon nanotube structure 44 for providing power or ground sources to a corresponding contact of component 14.

Further, each layer 66 of socket 12 may also comprise one or more electrically-conductive traces 68 engaging carbon nanotube structure 44. Traces 68 may extend to a location on socket to accommodate testing or interfacing with a particular contact 20 of component 14. Traces 68 may also be used to interface various contacts 20 of component 14 to other devices. For example, in this embodiment, socket 12 may comprise an electrical subassembly containing various electronic devices and adapted to interface with printed circuit board 16.

What is claimed is:

1. A socket, comprising:
    a substrate having a plurality of cavities extending therethrough; and
    an electrically-conductive carbon nanotube structure disposed within at least one of the cavities.

2. The system of claim 1, wherein the carbon nanotube structure comprises a plurality of carbon nanotubes.

3. The system of claim 1, wherein; the carbon nanotube structure comprises:
    a plurality of carbon nanotubes; and
    a binder disposed about the plurality of carbon nanotubes.

4. The system of claim 1, wherein the carbon nanotube structure extends beyond at least one side of the substrate.

5. The system of claim 1, wherein the carbon nanotube structure comprises a plurality of carbon nanotube units coupled together.

6. The system of claim 1, wherein the substrate comprises at least one layer electrically coupled to the carbon nanotube structure.

7. The system of claim 1, wherein the carbon nanotube structure is adapted to engage a contact of a printed circuit board.

8. The system of claim 1, wherein the carbon nanotube structure is adapted to engage a contact of an integrated circuit.

9. The system of claim 1, further comprising a mounting assembly adapted to secure an electronic component to the socket.

10. The system of claim 1, wherein at least one layer of the substrate comprises a trace conductively coupled to the carbon nanotube structure.

11. A method for producing a socket, comprising:
providing a substrate having a plurality of cavities extending through the substrate;
providing at least one electrically-conductive carbon nanotube structure; and
disposing the carbon nanotube structure within at least one of the cavities.

12. The method of claim 11, wherein providing at least one carbon nanotube structure comprises providing a plurality of carbon nanotube units coupled together.

13. The method of claim 11, wherein disposing comprises disposing the carbon nanotube structure within the cavity such that an end of the carbon nanotube structure extends beyond a surface of the substrate.

14. The method of claim 11, further comprising adapting an end of the carbon nanotube structure to engage a contact of an electronic component.

15. The method of claim 11, further comprising adapting an end of the carbon nanotube structure to engage a contact an integrated circuit.

16. The method of claim 11, wherein providing the carbon nanotube structure comprises providing the at least one carbon nanotube structure having a plurality of carbon nanotubes.

17. The method of claim 11, further comprising coupling a mounting assembly to the substrate adapted to secure an electronic component to the socket.

18. A socket, comprising:
means for supporting an electronic component;
means for securing the supporting means to a printed circuit board; and
at least one electrically-conductive carbon nanotube means disposed within the supporting means.

19. The system of claim 18, wherein the carbon nanotube means comprises a plurality of carbon nanotube units coupled together.

20. The system of claim 18, wherein the securing means is further adapted to secure an electronic component to the socket.

21. The system of claim 18, further comprising means for coupling the carbon nanotube means to the supporting means.

22. The system of claim 18, wherein the carbon nanotube means extends beyond at least one side of the supporting means.

23. The system of claim 18, wherein the carbon nanotube means comprises a plurality of carbon nanotubes.

24. The system of claim 18, wherein the carbon nanotube means comprises:
a plurality of carbon nanotubes; and
a binding means disposed about the plurality of carbon nanotubes.

25. The system of claim 18, wherein the supporting means comprises at least one layer electrically coupled to the carbon nanotube means.

26. The system of claim 18, wherein the supporting means comprises a trace electrically coupled to the carbon nanotube means.

27. A socket system, comprising:
a socket having at least one electrically-conductive carbon nanotube structure extending therethrough;
an electronic component adapted to conductively engage the carbon nanotube structure;
a printed circuit board adapted to conductively engage the carbon nanotube structure; and
a mounting assembly adapted to secure the electronic component and the socket to the printed circuit board.

28. The system of claim 27, wherein the carbon nanotube structure comprises a plurality of carbon nanotube units coupled together.

29. The system of claim 27, wherein the carbon nanotube structure extends beyond at least one side of the socket.

30. The system of claim 27, wherein at least one layer of the socket electrically engages the carbon nanotube structure.

31. The system of claim 27, wherein the mounting assembly comprises a plate adapted to clamp the electronic component and the socket to the printed circuit board.

32. The system of claim 27, wherein the nanotube structure comprises a plurality of carbon nanotubes.

33. The system of claim 27, wherein the carbon nanotube structure comprises:
a plurality of carbon nanotubes; and
a binder disposed about the plurality of carbon nanotubes.

34. The system of claim 27, wherein the electronic component comprises an integrated circuit.

35. The system of claim 27, wherein the electronic component comprises at least one conductive contact adapted to engage the carbon nanotube structure.

36. The system of claim 27, wherein the printed circuit board comprises at least one conductive contact adapted to engage the carbon nanotube structure.

37. The system of claim 27, wherein the socket comprises at least one conductive trace engaging the carbon nanotube structure.

* * * * *